(12) United States Patent
Cook et al.

(10) Patent No.: US 7,560,970 B2
(45) Date of Patent: Jul. 14, 2009

(54) LEVEL SHIFTER

(75) Inventors: Thomas D. Cook, Austin, TX (US);
Tahmina Akhter, Austin, TX (US);
Jeffrey C. Cunningham, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 30 days.

(21) Appl. No.: 11/835,552

(22) Filed: Aug. 8, 2007

(65) Prior Publication Data

US 2009/0039942 A1 Feb. 12, 2009

(51) Int. Cl.
*H03L 5/00* (2006.01)
(52) U.S. Cl. .......................... 327/333; 326/81
(58) Field of Classification Search ............. 326/62–63, 326/80–81; 327/306, 333
See application file for complete search history.

(56) References Cited

U.S. PATENT DOCUMENTS

| | | | |
|---|---|---|---|
| 5,821,800 A | 10/1998 | Le et al. | |
| 5,969,542 A | 10/1999 | Maley et al. | |
| 6,002,290 A | 12/1999 | Avery et al. | |
| 6,333,662 B1 * | 12/2001 | Umezawa et al. | ........... 327/333 |
| 6,466,054 B2 | 10/2002 | Kameyama et al. | |
| 6,518,818 B1 | 2/2003 | Hynes | |
| 6,556,047 B2 | 4/2003 | Debaty | |
| 6,639,427 B2 | 10/2003 | Dray et al. | |
| 6,642,769 B1 | 11/2003 | Chang et al. | |
| 6,985,022 B2 | 1/2006 | Kanno et al. | |
| 7,100,617 B1 | 9/2006 | Maginot | |
| 7,187,205 B2 * | 3/2007 | Ramaraju et al. | ............. 326/81 |
| 7,317,335 B2 * | 1/2008 | Min et al. | ...................... 326/81 |
| 7,348,800 B2 * | 3/2008 | Koto et al. | .................... 326/80 |
| 7,382,158 B2 * | 6/2008 | Kimura | ....................... 326/81 |
| 7,414,435 B2 * | 8/2008 | Kuzmenka et al. | ........... 326/81 |
| 2002/0175737 A1 | 11/2002 | Debaty | |
| 2003/0042965 A1 | 3/2003 | Kanno et al. | |

* cited by examiner

*Primary Examiner*—Dinh T. Le
(74) *Attorney, Agent, or Firm*—James L. Clingan, Jr.; Daniel D. Hill

(57) ABSTRACT

A level converter comprises first and second latches, and first through fourth transistors. The first latch has first and second power supply terminals, and first and second nodes. The second latch has third and fourth power supply terminals, and third and fourth nodes. The first transistor has a first current electrode coupled to the first node, a control electrode coupled to receive a first bias voltage, and a second current electrode. The second transistor has a first current electrode coupled to the second current electrode of the first transistor, a second current electrode coupled to the third node, and a control electrode coupled to receive a second bias voltage. The third transistor has a first current electrode coupled to the second node, a control electrode coupled to receive the first bias voltage, and a second current electrode. The fourth transistor has a first current electrode coupled to the second current electrode of the third transistor, a control electrode coupled to receive the second bias voltage, and a second current electrode coupled to the fourth node.

19 Claims, 3 Drawing Sheets

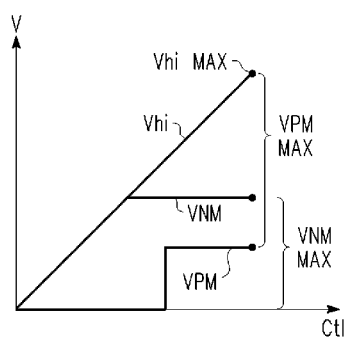 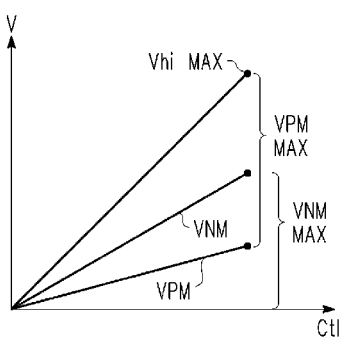 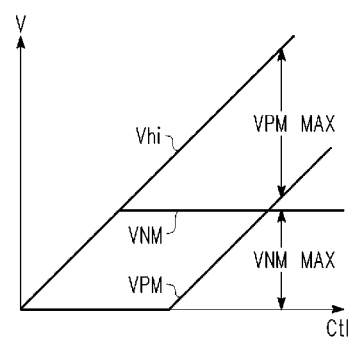
*FIG. 2*    *FIG. 3*    *FIG. 4*

US 7,560,970 B2

LEVEL SHIFTER

BACKGROUND

1. Field

This disclosure relates generally to integrated circuits, and more specifically, to level shifters.

2. Related Art

Level shifters are generally for changing the voltage levels of logic signals. One situation where they are commonly used is for programming and erasing of non-volatile memory (NVM) in which the logic, which determines which memory cells are to be programmed or erased, is operated at a much lower voltage than that required for performing the program or erase. For example, it is common for the logic of an integrated circuit to be operated at around one volt while the program or erase function is carried out at about ten volts. Conventional level shifters can generally be designed to be effective in this situation if the program or erase voltage is held within a narrow range. A technique for improving the endurance or reliability of NVM cells is to change the program or erase voltage based on the condition of the NVM. This can be based on the number of program and erase cycles or on the actual measured program or erase condition of a particular NVM cell. The program or erase voltage can be as low as 6 volts or as high as 14 volts. A 6 volt to 14 volt range raises some problems with conventional level shifters. One problem is the lower current drive capability at the lower voltage and the breakdown voltage of the transistors that are used in the level shifter at the higher voltage. Current drive can be increased by increasing the size of the transistors of the level shifter, but this is an undesirable solution because that increases the size of the circuit. Breakdown voltage can be addressed by adding transistors, but that not only increases size but also increases the number of transistors in the output path which increases output resistance and thus reduces speed of operation. Stacking transistors also increases the minimum operating voltage.

Thus there is a need for a level shifter that reduces or eliminates the adverse affects described above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 2 is a graph of three voltages for use in the circuit of the level shifter of FIG. 1 according to a first approach;

FIG. 3 is a graph of the three voltages according to a second approach;

FIG. 4 is a graph of the three voltages according to a third approach; and

DETAILED DESCRIPTION

In one aspect, a level shifter has a first latch operated between a power supply voltage and a first intermediate voltage and second latch operated between ground and a second intermediate voltage. The first and second intermediate voltages are selected to ensure that they do not exceed breakdown voltages of the first and second latches over the relevant range of the power supply voltage Having first and second latches avoids increasing the output resistance while still avoiding breakdown.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Figure 1:
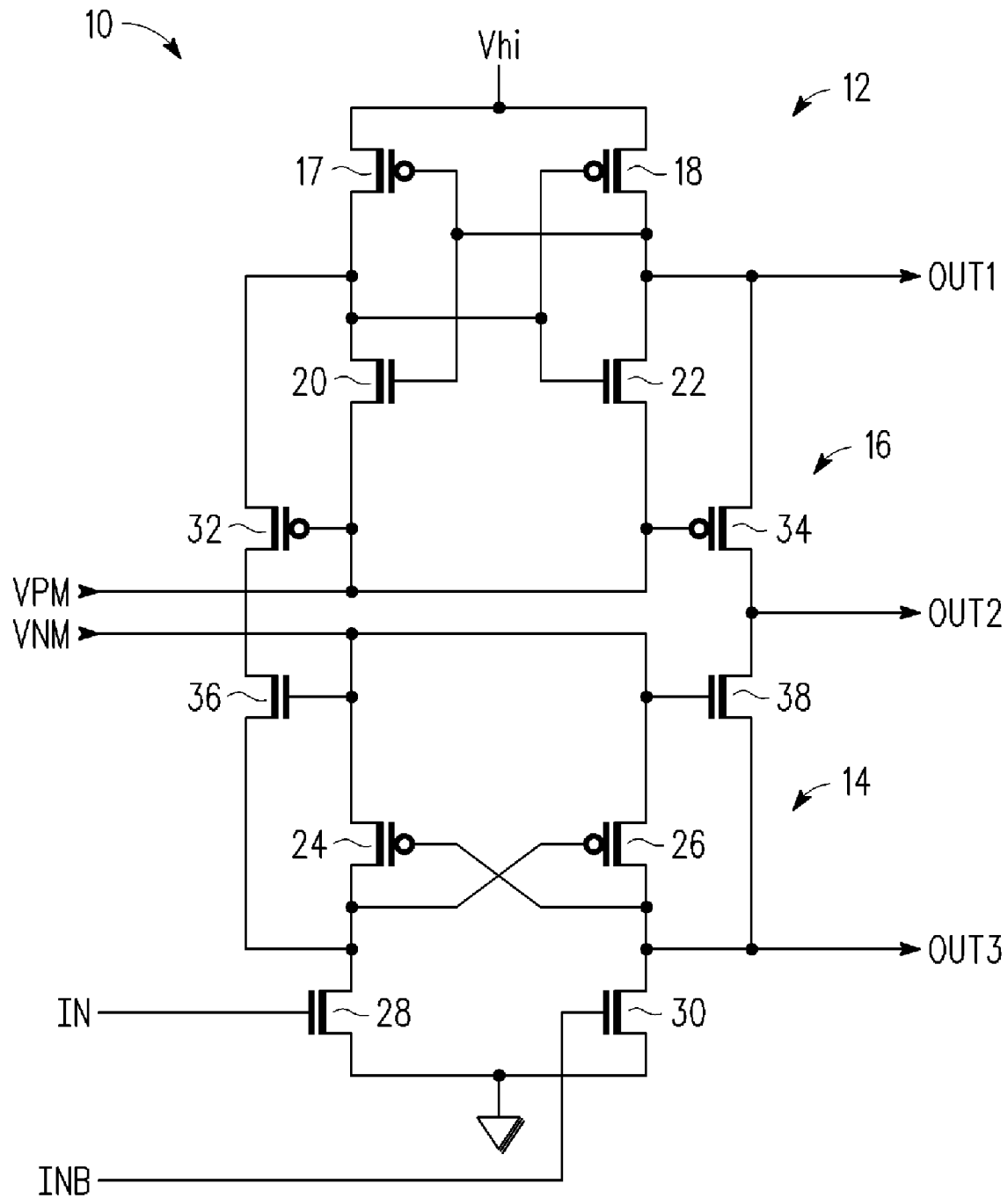
FIG. 1 is a circuit diagram of a level shifter according to one embodiment.

Shown in FIG. 1 is a level shifter 10 comprising a P latch 12, an N latch 14, and a transfer circuit 16. Latch 12 comprises P channel transistors 17 and 18 and N channel transistors 20 and 22. Latch 14 comprises P channel transistors 24 and 26 and N channel transistors 28 and 30. Transfer circuit 16 comprises P channel transistors 32 and 34 and N channel transistors 36 and 38. Transistor 17 has a source connected to a node for receiving a high voltage Vhi (this node may be referenced as Vhi) and a gate and a source. Transistor 18 has a source connected to Vhi, a gate connected to the drain of transistor 17, and a drain connected to the gate of transistor 17. Transistor 20 has a drain connected to the drain of transistor 17, a gate connected to the gate of transistor 17, and a source connected to a node for receiving an intermediate voltage VPM (this node may be referred to as VPM). Transistor 22 has a drain connected to the drain of transistor 18, a gate connected to the gate of transistor 18, and a source connected to VPM.

Transistor 28 has a source connected to ground, a gate for receiving an input signal IN and a source. Transistor 30 has a source connected to ground, a gate for receiving a complementary input signal INB, and a drain. Transistor 24 has a drain connected to the drain of transistor 28, a gate connected to the drain of transistor 30, and a source connected to a node for receiving an intermediate voltage VNM (this node may be referred to as VNM). Transistor 26 has a drain connected to the drain of transistor 30, a gate connected to the gate of transistor 28, and a source connected to VNM.

Transistor 32 has a source connected to the drain of transistor 17, a gate connected to VPM, and a drain. Transistor 34 has a source connected to the drain of transistor 18, a gate connected to VPM, and a drain. Transistor 36 has a source connected to the drain of transistor 28, a gate connected to VNM, and a drain connected to the drain of transistor 32. Transistor 38 has a source connected to the drain of transistor 30, a gate connected to VNM, and a drain connected to the drain of transistor 34.

Voltage VPM is preferably a positive voltage less than voltage Vhi with the difference between voltages VPM and Vhi less than a breakdown voltage of latch 12. Similarly, voltage VNM is preferably a positive voltage less than a breakdown voltage of latch 14. In operation latch 10 receives input signal IN at a logic high (which may also be called a logic 1) and input signal INB at a logic low (which may be called a logic 0) which may be 1.2 volts and provides an output OUT1 at a logic high at a voltage Vhi. This is achieved by the logic high of input OUT causing transistor 28 to be conductive and transistor 30 to be non-conductive. Transistor 28 causes a logic low to be applied to the gate of transistor 26 causing transistor 26 to be conductive. Transistor 26 being conductive and transistor 30 being non-conductive causes voltage VNM to be present on the gate of transistor 24 causing transistor 24 to be non-conductive. Transistor 36 has voltage VNM on its gate and ground on its source so that its drain is pulled to ground which also causes the drain of transistor 32 to be at ground. In such a situation, transistors 36 and 28 provide a path to ground so that the drains of transistors 17 and 20 can have current drawn from them through transistor 32. Transistor 32, with its gate at voltage VPM, limits how far the voltage can drop on the drains of transistors 20 and 17 to one threshold voltage above VPM. Transistors 38 prevents current flow from the drains of transistors 18 and 22 so that with the drains of transistors 17 and 20 at one threshold voltage above VPM, transistor 18 is conductive and provides voltage Vhi on the drains of transistors 18 and 22. The drains of transistors 18 and 22 are output OUT1. With OUT1 at Vhi, transistor 20 is conductive so that the drains of transistors 17 and 20 are at voltage VPM. In this condition of level shifter 10, OUT1 is at voltage Vhi, which may be used for programming or erasing NVM cells. Also in this condition, the maximum magnitude of the gate to source voltage or gate to drain voltage, which is typically has the lowest breakdown voltage of a transistor, is voltage Vhi minus voltage VPM for latch 12. Similarly, for latch 14, the largest magnitude of the gate to source/drain voltage is voltage VNM. Further, transistor 18 is the only transistor in the path from Vhi to output OUT1 of level shifter 10 so that there is no added resistance to OUT1. Further this remains true as voltage Vhi changes. Voltage VNM and voltage Vhi minus voltage VPM are kept low enough to ensure the gate to source/drain breakdown voltages of the transistors are not reached. If necessary, voltage VPM can change as voltage Vhi is varied to ensure that the difference does not exceed the gate to source/drain breakdown.

Two other outputs in addition to OUT1 are shown in FIG. 1. An output OUT2 is provided at the drains of transistors 34 and 38. Voltage Vhi is provided on OUT2 through transistors 18 and 34 with the input conditions of input IN at a logic high and complementary input INB at a logic low. An output OUT3 is provided at the drains of transistors 26 and 30 and provide a voltage of VNM through transistor 26.

For the case where input IN is a logic low and INB is a logic high, transistor 28 is non-conductive and transistor 30 is conductive. Transistor 24 becomes conductive causing transistor 26 to become non-conductive. This causes transistor 38 to be conductive and able to draw current from OUT1. On the other hand transistor 36 is prevented from drawing current from the drains of transistors 17 and 20. As current is drawn from OUT1, OUT1 begins declining in voltage causing transistor 17 to begin being conductive and transistor 20 begin being non-conductive. This causes transistor 18 to become less conductive and transistor 22 to begin conducting. This continues until transistors 17 and 22 are conductive and transistors 18 and 20 are non-conductive. As a result output OUT1 becomes a logic low (which may also be called a zero) at voltage VPM. There is only transistor 22 between output OUT1 and voltage VPM. Outputs OUT2 and OUT3 are at ground. Output OUT3 has a benefit of only one transistor between it and ground.

Shown in FIGS. 2, 3, and 4 are graphs of ways of providing the three voltages of Vhi, VPM, and VPN in response to a control signal Ctl. Signal Ctl may be a digital input to a digital to analog (D/A) converter. The graph of FIG. 3 has a primary benefit of simplicity because it may be achieved with a simple voltage divider. A way to determine the parameters for voltages VNM and VPM is to begin with the highest voltage of voltage Vhi and then determine the maximum allowable voltage for voltage VNM and for voltage Vhi minus voltage VPM. With a voltage divider established for those conditions, voltages VNM and VPM are effective for the highest voltage of voltage Vhi and are ensured of also being adequate for lower voltages of voltage Vhi. A disadvantage of this approach is that there is a limit to how low voltage Vhi may be allowed to go for it to function. If the lowest voltage is close to the lowest functioning voltage, it may be necessary to increase the size of the transistors for adequate speed of operation.

The graph of FIG. 4 is for the case where speed of performance is very important. In this case voltage VMN follows the voltage of Vhi until the maximum for voltage VMN is reached and is held at that voltage with further increases in voltage Vhi. Voltage VPM is held at ground until the maximum allowable magnitude of voltage Vhi minus voltage VPM is reached and thereafter voltage VPM tracks Vhi. This provides for the maximum available voltage of operation for latches 12 and 14 for lower voltages of voltage Vhi and maximum allowable voltage of operation otherwise.

The graph of FIG. 2 provides for a combination of simplicity due to be able to use existing circuit resources and optimum low voltage operation. In this case voltage VPM is held at ground and voltage VNM follows voltage Vhi for low voltages of Vhi. After a certain level is reached, voltage VPM is brought to a raised level and maintained at that level with further increases in voltage Vhi. After a somewhat larger voltage is reached, voltage VNM is held at a fixed level with subsequent increases in voltage Vhi. This approach is the same as that of FIG. 4 for voltage VNM. In the case of voltage VPM, there is a sacrifice of speed for the levels of voltage Vhi near but greater than the voltage where voltage VPM is raised to the fixed level. This is a tradeoff of speed for an increase in simplicity.

Figure 5:
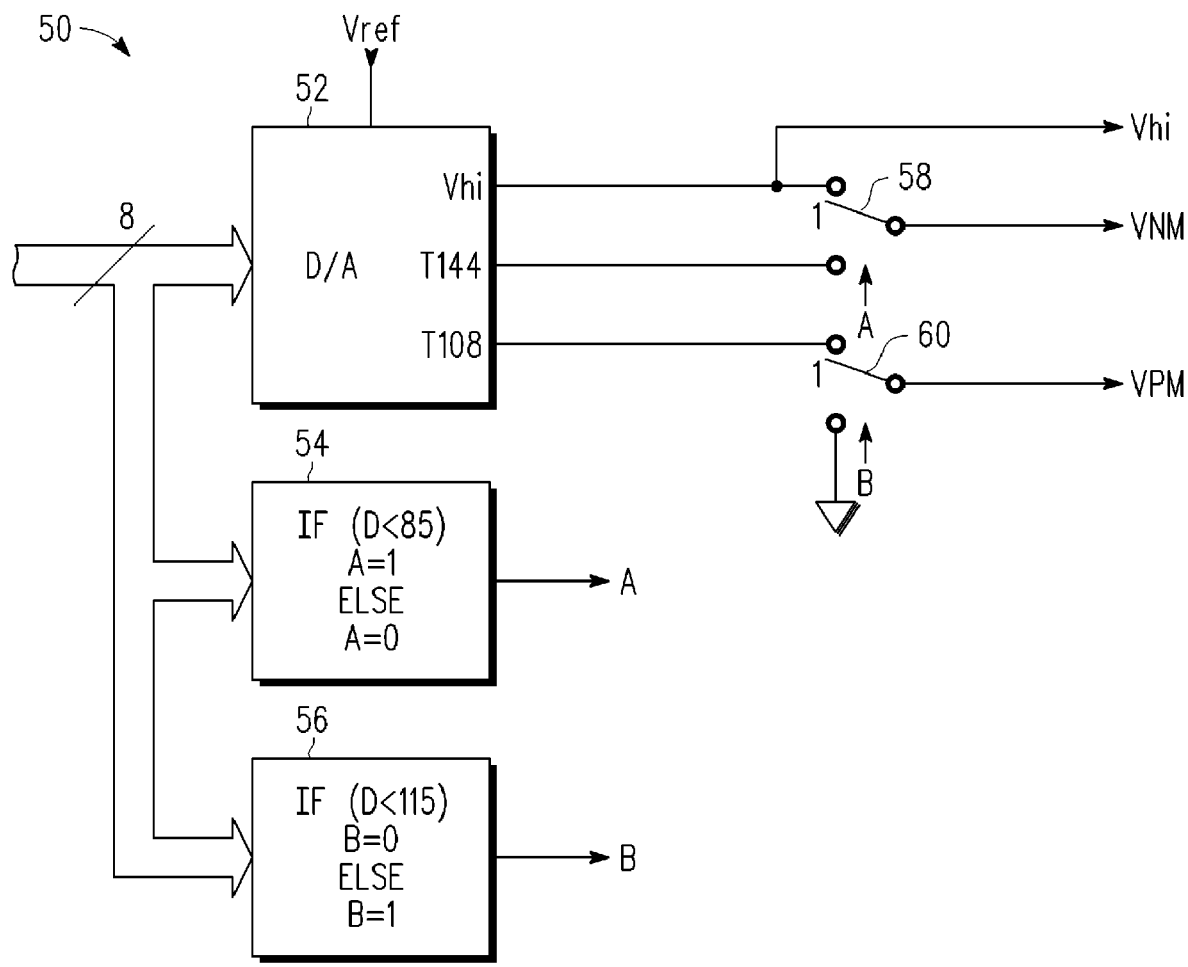
FIG. 5 is a block diagram for generating the three voltages according to the first approach.

Shown in FIG. 5 is a circuit 50 for use in implementing the approach of FIG. 2 for voltages Vih, VPM, and VNM. Circuit 50 comprises a D/A converter 52, a decoder 54, a decoder 56, a switch 58, and a switch 60. Decoder 54 controls switch 58 with output A. Decoder 56 controls switch 60 with output B. D/A converter 52 and decoders 54 and 56 receive an 8 bit input that selects the level of voltage Vhi. The 8 bit input thus has up to 256 choices for voltage Vhi. D/A converter 52 receives a reference voltage Vref that is used in obtaining voltage Vhi. In a typical D/A converter, there is a resistor stack with a tap for each possible output level that is used to provide the analog output that is selected by the digital input to the D/A converter. In this example, of 256 levels, the levels chosen are tap T144 for use as voltage VNM and tap T108 for voltage VPM. In this case Vref is chosen to be about 14 volts so that tap T108 is about 6 volts and tap T144 is about 8 volts. Decoder 54 detects if the input is less than 85. If less than 85, then switch 58 couples voltage Vhi to the node for voltage VNM. If the input is 85 or more then the level of voltage Vhi is selected to be about 4.6 volt or more, and the voltage of about 8 volts is applied as voltage VNM by switch 58. At an input of less than 115 to decoder 56, switch 60 switches ground to the node for voltage VPM. At an input of 115 or greater to decoder 56, which is a voltage of about 6.3 volts or more for voltage Vhi, switch 60 switches tap T108, about 6 volts, to the node for voltage VPM. Thus with the voltage of 14 volts for voltage Vhi, the difference between voltage Vhi and voltage VPM is about 8 volts which is also the voltage for voltage VNM with voltage Vhi at 14 volts.

By now it should be appreciated that there has been provided a level converter having a first latch, a second latch, a first transistor, a second transistor, a third transistor, and a fourth transistor. The first latch has first and second power supply terminals, and first and second nodes. The second latch has third and fourth power supply terminals, and third and fourth nodes. The first transistor has a first current electrode coupled to the first node, a control electrode coupled to receive a first bias voltage, and a second current electrode. The second transistor has a first current electrode coupled to the second current electrode of the first transistor, a second current electrode coupled to the third node, and a control electrode coupled to receive a second bias voltage. The third transistor has a first current electrode coupled to the second node, a control electrode coupled to receive the first bias voltage, and a second current electrode. The fourth transistor has a first current electrode coupled to the second current electrode of the third transistor, a control electrode coupled to receive the second bias voltage, and a second current electrode coupled to the fourth node. The first latch may comprise a pair of cross-coupled inverters. The first power supply voltage terminal may be for receiving a first power supply voltage, the fourth power supply voltage terminal may be coupled to ground, the second power supply voltage terminal may be coupled to receive a first intermediate level voltage, and the third power supply voltage terminal may be coupled to receive a second intermediate level voltage. The first and second intermediate level voltages may be equal to approximately one half of the first power supply voltage. The control electrodes of the first and third transistors may be coupled to the second power supply voltage terminal, and the control electrodes of the second and fourth transistors may be coupled to the third power supply voltage terminal. The level converter may further comprise a digital-to-analog converter for providing a second power supply voltage to the second power supply voltage terminal, and a third power supply voltage to the third power supply voltage terminal in response to a control value. The second power supply voltage may be different from the third power supply voltage. The second latch may comprise a fifth transistor having a first current electrode coupled to the third power supply voltage terminal, a second current electrode coupled to the third node, and a control electrode; a seventh transistor having a first current electrode coupled to the second current electrode of the fifth transistor, a control electrode for receiving a first input signal, and a second current electrode coupled to the fourth power supply voltage terminal; and an eighth transistor having a first current electrode coupled to the second current electrode of the sixth transistor, a control electrode for receiving a second input signal, and a second current electrode coupled to the fourth power supply voltage terminal. The fifth and sixth transistors may be characterized as being P-channel transistors and the seventh and eighth transistors may be characterized as being N-channel transistors. The first and third transistors may be characterized as being P-channel transistors and the second and fourth transistors may be characterized as being N-channel transistors.

Also described is a level converter having a first latch, a second latch, a first transfer circuit, an a second transfer circuit. The first latch has first and second power supply terminals, and first and second nodes. The second latch having third and fourth power supply terminals, and third and fourth nodes. The first transfer circuit has a first terminal coupled to the first node, a second terminal coupled to the third node, and a control terminal coupled to receive a first bias voltage. The second transfer circuit has a first terminal coupled to the second node, a second terminal coupled to the fourth node, and a control terminal coupled to receive the first bias voltage. The first power supply voltage terminal is for receiving a first power supply voltage, the second power supply voltage terminal is from receiving a first intermediate level voltage, the third power supply voltage terminal is for receiving a second intermediate level voltage, and the fourth power supply voltage terminal is coupled to ground. The first and second intermediate level voltages are between the first power supply voltage and ground. The control terminal of the first and second transfer circuits may be coupled to the second power supply voltage terminal. The first transfer circuit may comprise a first transistor having a first current electrode coupled to the first node, a control electrode for receiving the first bias voltage, and a second current electrode; and a second transistor having a first current electrode coupled to the second current electrode of the first transistor, a control electrode for receiving a second bias voltage, and a second current electrode coupled to the third node. The second transfer circuit may comprise a third transistor having a first current electrode coupled to the second node, a control electrode for receiving the first bias voltage, and a second current electrode; and a fourth transistor having a first current electrode coupled to the second current electrode of the third transistor, a control electrode for receiving the second bias voltage, and a second current electrode coupled to the fourth node. The first latch may comprise a first inverter having an input terminal coupled to the first node, and an output coupled to the second node; and a second inverter having an input terminal coupled to the second node, and an output terminal coupled to the first node. The second latch may comprise a first transistor having a first current electrode coupled to the third power supply voltage terminal, a second current electrode coupled to the third node, and a control electrode; a second transistor having a first current electrode coupled to the third power supply voltage terminal, a control electrode coupled to the second current electrode of the first transistor, and a second current electrode coupled to the control electrode of the first transistor at the fourth node; a third transistor having a first current electrode coupled to the second current electrode of the first transistor, a control electrode for receiving a first input signal, and a second current electrode coupled to the fourth power supply voltage terminal; and a fourth transistor having a first current electrode coupled to the second current electrode of the second transistor, a control electrode for receiving a second input signal, and a second current electrode coupled to the fourth power supply voltage terminal. The first bias voltage may be provided by a digital-to-analog converter in response to receiving a control value.

Further described is a method for converting a signal from one voltage level to another voltage level. The method includes providing a first latch having first and second power supply voltage terminals. The method includes providing a second latch having third and fourth power supply voltage terminals. The method includes coupling the first latch to a second latch. The method includes providing a first power supply voltage to the first power supply voltage terminal, and coupling the fourth power supply voltage terminal to a reference potential. The method includes providing a first intermediate voltage to the second power supply voltage terminal, and a second intermediate voltage to the third power supply voltage terminal, wherein the first and second intermediate voltages are between the first power supply voltage and the reference potential. The method includes providing the signal to the second latch. The method includes receiving a level converted signal corresponding to the signal from an output of the first latch. The method may be further characterized by the coupling the first latch to the second latch comprising providing first and second transistors coupled in series between a node of the first latch and a node of the second latch, the first transistor having a control electrode for receiving a first bias voltage and the second transistor having a control electrode for receiving a second bias voltage. The method may be further characterized by the first bias voltage and the second bias voltage are provided by a digital-to-analog converter in response to a control value.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed. Also ground potential may be a negative power supply terminal.

Although the invention is described herein with reference to specific embodiments, various modifications and changes can be made without departing from the scope of the present invention as set forth in the claims below. For example, other schemes than those shown for providing voltages Vhi, VNM, and VPM may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A level converter, comprising:
   a first latch having first and second power supply terminals, and first and second nodes;
   a second latch having third and fourth power supply terminals, and third and fourth nodes;
   a first transistor having a first current electrode coupled to the first node, a control electrode coupled to receive a first bias voltage, and a second current electrode;
   a second transistor having a first current electrode coupled to the second current electrode of the first transistor, a second current electrode coupled to the third node, and a control electrode coupled to receive a second bias voltage;
   a third transistor having a first current electrode coupled to the second node, a control electrode coupled to receive the first bias voltage, and a second current electrode; and
   a fourth transistor having a first current electrode coupled to the second current electrode of the third transistor, a control electrode coupled to receive the second bias voltage, and a second current electrode coupled to the fourth node.

2. The level converter of claim 1, wherein the first latch comprises a pair of cross-coupled inverters.

3. The level converter of claim 1, wherein the first power supply voltage terminal is for receiving a first power supply voltage, the fourth power supply voltage terminal is coupled to ground, the second power supply voltage terminal is coupled to receive a first intermediate level voltage, and the third power supply voltage terminal is coupled to receive a second intermediate level voltage.

4. The level converter of claim 3, wherein the first and second intermediate level voltages are equal to approximately one half of the first power supply voltage.

5. The level converter of claim 1, wherein the control electrodes of the first and third transistors are coupled to the second power supply voltage terminal, and the control electrodes of the second and fourth transistors are coupled to the third power supply voltage terminal.

6. The level converter of claim 5, further comprising a digital-to-analog converter for providing a second power supply voltage to the second power supply voltage terminal, and a third power supply voltage to the third power supply voltage terminal in response to a control value.

7. The level converter of claim 6, wherein the second power supply voltage is different from the third power supply voltage.

8. The level converter of claim 1, wherein the second latch comprises:
   a fifth transistor having a first current electrode coupled to the third power supply voltage terminal, a second current electrode coupled to the third node, and a control electrode;
   a seventh transistor having a first current electrode coupled to the second current electrode of the fifth transistor, a control electrode for receiving a first input signal, and a second current electrode coupled to the fourth power supply voltage terminal; and
   an eighth transistor having a first current electrode coupled to the second current electrode of the sixth transistor, a control electrode for receiving a second input signal, and a second current electrode coupled to the fourth power supply voltage terminal.

9. The level converter of claim 8, wherein the fifth and sixth transistors are characterized as being P-channel transistors and the seventh and eighth transistors are characterized as being N-channel transistors.

10. The level converter of claim 1, wherein the first and third transistors are characterized as being P-channel transistors and the second and fourth transistors are characterized as being N-channel transistors.

11. A level converter comprising:
    a first latch having first and second power supply terminals, and first and second nodes;
    a second latch having third and fourth power supply terminals, and third and fourth nodes;
    a first transfer circuit having a first terminal coupled to the first node, a second terminal coupled to the third node, and a control terminal coupled to receive a first bias voltage; and
    a second transfer circuit having a first terminal coupled to the second node, a second terminal coupled to the fourth node, and a control terminal coupled to receive the first bias voltage;
    wherein the first power supply voltage terminal is for receiving a first power supply voltage, the second power supply voltage terminal is from receiving a first intermediate level voltage, the third power supply voltage terminal is for receiving a second intermediate level voltage, and the fourth power supply voltage terminal is coupled to ground, and wherein the first and second intermediate level voltages are between the first power supply voltage and ground.

12. The level converter of claim 11, wherein the control terminal of the first and second transfer circuits is coupled to the second power supply voltage terminal.

13. The level converter of claim 11, wherein the first transfer circuit comprises:
- a first transistor having a first current electrode coupled to the first node, a control electrode for receiving the first bias voltage, and a second current electrode; and
- a second transistor having a first current electrode coupled to the second current electrode of the first transistor, a control electrode for receiving a second bias voltage, and a second current electrode coupled to the third node.

14. The level converter of claim 13, wherein the second transfer circuit comprises:
- a third transistor having a first current electrode coupled to the second node, a control electrode for receiving the first bias voltage, and a second current electrode; and
- a fourth transistor having a first current electrode coupled to the second current electrode of the third transistor, a control electrode for receiving the second bias voltage, and a second current electrode coupled to the fourth node.

15. The level converter of claim 11, wherein the first latch comprises:
- a first inverter having an input terminal coupled to the first node, and an output coupled to the second node; and
- a second inverter having an input terminal coupled to the second node, and an output terminal coupled to the first node.

16. The level converter of claim 11, wherein the second latch comprises:
- a first transistor having a first current electrode coupled to the third power supply voltage terminal, a second current electrode coupled to the third node, and a control electrode;
- a second transistor having a first current electrode coupled to the third power supply voltage terminal, a control electrode coupled to the second current electrode of the first transistor, and a second current electrode coupled to the control electrode of the first transistor at the fourth node;
- a third transistor having a first current electrode coupled to the second current electrode of the first transistor, a control electrode for receiving a first input signal, and a second current electrode coupled to the fourth power supply voltage terminal; and
- a fourth transistor having a first current electrode coupled to the second current electrode of the second transistor, a control electrode for receiving a second input signal, and a second current electrode coupled to the fourth power supply voltage terminal.

17. The level converter of claim 11, wherein the first bias voltage is provided by a digital-to-analog converter in response to receiving a control value.

18. A method for converting a signal from one voltage level to another voltage level comprising:
- providing a first latch having first and second power supply voltage terminals;
- providing a second latch having third and fourth power supply voltage terminals;
- coupling the first latch to a second latch;
- providing a first power supply voltage to the first power supply voltage terminal, and coupling the fourth power supply voltage terminal to a reference potential;
- providing a first intermediate voltage to the second power supply voltage terminal, and a second intermediate voltage to the third power supply voltage terminal, wherein the first and second intermediate voltages are between the first power supply voltage and the reference potential;
- providing the signal to the second latch; and
- receiving a level converted signal corresponding to the signal from an output of the first latch;
- wherein coupling the first latch to the second latch comprises providing first and second transistors coupled in series between a node of the first latch and a node of the second latch, the first transistor having a control electrode for receiving a first bias voltage and the second transistor having a control electrode for receiving a second bias voltage.

19. The method of claim 18, wherein the first bias voltage and the second bias voltage are provided by a digital-to-analog converter in response to a control value.

* * * * *